(12) United States Patent
Chung et al.

(10) Patent No.: US 6,884,675 B2
(45) Date of Patent: Apr. 26, 2005

(54) SEMICONDUCTOR CAPACITORS HAVING TANTALUM OXIDE LAYERS AND METHODS FOR MANUFACTURING THE SAME

(75) Inventors: Jeong-hee Chung, Seoul (KR); In-sung Park, Seoul (KR); Jae-hyun Yeo, Incheon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 10/808,141

(22) Filed: Mar. 24, 2004

(65) Prior Publication Data

US 2004/0180493 A1 Sep. 16, 2004

Related U.S. Application Data

(62) Division of application No. 10/047,706, filed on Jan. 15, 2002, now Pat. No. 6,734,480.

(30) Foreign Application Priority Data

Jan. 19, 2001 (KR) .......................................... 2001-3165

(51) Int. Cl.$^7$ .......................................... H01L 21/8242
(52) U.S. Cl. .......................... 438/240; 438/396; 438/785
(58) Field of Search ........................... 438/3, 240, 253, 438/254, 255, 396, 397, 398, 785; 427/255.31

(56) References Cited

U.S. PATENT DOCUMENTS

| 5,907,780 | A | | 5/1999 | Gilmer et al. ............... 438/299 |
|---|---|---|---|---|
| 6,037,235 | A | | 3/2000 | Narwankar et al. ......... 438/396 |
| 6,124,620 | A | | 9/2000 | Gardner et al. ............. 257/411 |
| 6,616,972 | B1 | * | 9/2003 | Senzaki et al. ........ 427/255.31 |
| 2002/0050363 | A1 | * | 5/2002 | Hagiya ......................... 169/16 |
| 2003/0003235 | A1 | * | 1/2003 | Shiho et al. ............. 427/376.2 |

FOREIGN PATENT DOCUMENTS

| KR | 1996-035876 | 10/1996 |
|---|---|---|
| KR | 1998-026863 | 7/1998 |

OTHER PUBLICATIONS

Bradley, D.C. Metal Alkoxides as Precursors for Electronic and Ceramic Materials, *Chem. Rev.* 89, 1317–1322 (1989).

Kawahara, T. et al. Conformal Step Coverage of (Ba,Sr)TiO$_3$ Films Prepared by Liquid Source CVD Using Ti(t–BuO)$_2$(DPM)$_2$ *Jpn. J. Appl. Phys.* 38, 2205–2209 (1999).

Rhee et al. *Chemical Vapor Deposition Precursors for (Ba,Sr)TiO3 Films*, Laboratory for Advanced Materials Processing (LAMP), Dept. of Chem. Eng., Pohang University of Science and Technology, 233–234 (1999).

* cited by examiner

*Primary Examiner*—Tuan H. Nguyen
(74) *Attorney, Agent, or Firm*—Myers Bigel Sibley & Sajovec, P.A.

(57) ABSTRACT

Semiconductor capacitors comprise first electrodes, second electrodes, and tantalum oxide layers positioned between the first electrodes and the second electrodes. The tantalum oxide layers are formed by depositing at least one precursor and ozone gas, the at least one precursor represented by the formula:

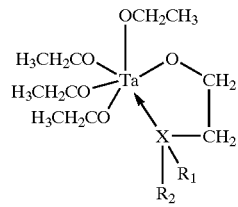

wherein X is selected from the group consisting of nitrogen, sulfur, oxygen, and a carbonyl group; and wherein R1 and R2 are independently alkyl.

23 Claims, 3 Drawing Sheets

SEMICONDUCTOR CAPACITORS HAVING TANTALUM OXIDE LAYERS AND METHODS FOR MANUFACTURING THE SAME

CROSS-REFERENCE TO RELATED APPLICATIONS

This application is a divisional of U.S. application Ser. No. 10/047,706 filed on Jan. 15, 2002, now U.S. Pat. No. 6,734,480, which claims priority to Korean Patent Application No. 01-3165 filed Jan. 19, 2001, the disclosures of which are incorporated herein by reference in their entireties.

FIELD OF THE INVENTION

The present invention generally relates to semiconductor capacitors, methods of making semiconductor capacitors, as well as microelectronic devices comprising semiconductor capacitors.

BACKGROUND OF THE INVENTION

As the integration density of semiconductor devices increases, the employment of dielectric layers having relatively high dielectric constants is desirable for potentially securing high capacitance in relatively small areas. One representative example of a dielectric layer having a relatively high dielectric constant is a tantalum oxide ($Ta_2O_5$) layer.

Notwithstanding its relatively high dielectric constant, the use of the tantalum oxide layer is potentially problematic in that it typically is potentially highly reactive with polysilicon present as a lower electrode in a conventional capacitor. In particular, polysilicon is usually oxidized in the formation of a tantalum oxide layer or a thermal treatment process after the formation of a tantalum oxide layer.

In an attempt to address this problem, lower electrodes have been formed from materials which are believed to be relatively difficult to oxidize. Examples of such materials include noble metals such as platinum (Pt), ruthenium (Ru), or iridium (Ir), or a conductive metal nitride layer such as titanium nitride (TiN). However, the use of a noble metal or metal nitride also presents potential problems. A conventional tantalum oxide layer is typically formed by chemical vapor deposition in an oxygen atmosphere using pentaethoxide tantalum (PET), $Ta(OCH_3)_5$, or $TaCl_5$ as a tantalum source. Oxygen ($O_2$), water ($H_2O$), hydrogen peroxide ($H_2O_2$), or nitrous oxide ($N_2O$) is employed as an oxygen source in such a method. Notwithstanding any advantages associated therewith, a composition of these source gases often negatively impacts the coverage of the tantalum oxide layer, presumably due to the oxidation of the lower electrode. For example, when a ruthenium (Ru) layer is used as a lower electrode, the surface of the Ru layer is oxidized by an oxygen source which results in the formation of $RuO_2$.

The formation of $RuO_2$ is carried out so as to minimize or prevent the formation of a tantalum oxide layer. The formation of a tantalum oxide layer often occurs when such a layer is used as a dielectric layer in a cylindrical or concave-shaped capacitor having a large aspect ratio. In such an instance, the tantalum oxide layer is not deposited on the lower portion of the cylindrical opening in the Ru electrode. Instead, the tantalum oxide layer is typically deposited on the upper portion to deteriorate step coverage of this layer.

There is a need in the art to address the above-mentioned problems in the art. More specifically, there is a need in the art to provide a semiconductor capacitor having a tantalum oxide layer present thereon with a more uniform thickness. It would be desirable to obtain a capacitor having a relatively high aspect ratio.

SUMMARY OF THE INVENTION

In one aspect, the invention provides semiconductor capacitors comprising first electrodes, second electrodes, and tantalum oxide layers positioned between the first electrodes and the second electrodes. The tantalum oxide layers are formed by depositing at least one precursor and ozone gas, with the precursor represented by the formula:

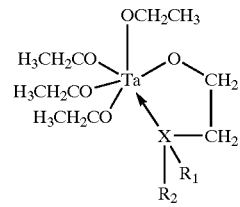

wherein X is selected from the group consisting of nitrogen, sulfur, oxygen, and a carbonyl group, and $R_1$ and $R_2$ are independently alkyl (e.g., $C_1$ to $C_4$ alkyl).

In another aspect, the invention provides methods of making semiconductor capacitors. The methods comprise forming first electrodes on semiconductor substrates, and then forming tantalum oxide layers on the first electrodes by depositing at least one precursor and ozone gas. The at least one precursor is represented by the formula:

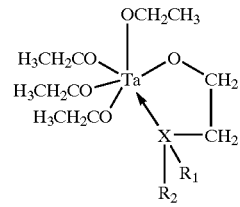

wherein X is selected from the group consisting of nitrogen, sulfur, oxygen, and a carbonyl group; and $R_1$ and $R_2$ may be independently alkyl; and forming second electrodes on the tantalum oxide layers.

These and other aspects and advantages of the present invention are described herein.

DETAILED DESCRIPTION OF THE INVENTION

Figure 1:
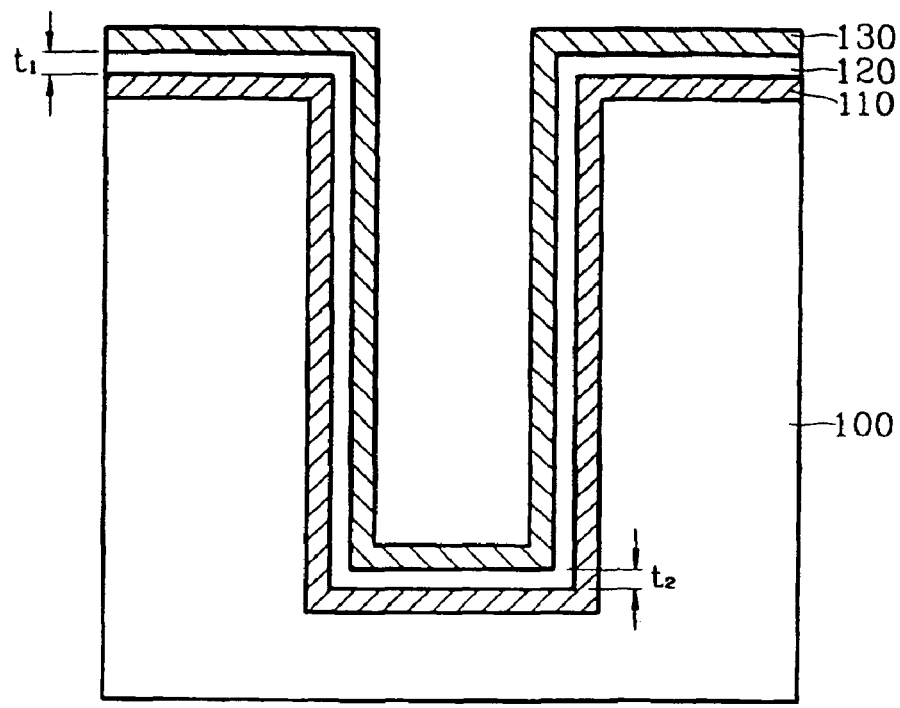
FIG. 1 illustrates a cylindrical capacitor formed according to a preferred embodiment of the present invention.

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout. It will also be understood that when a layer is referred to as being "on" another layer or substrate, it can be directly on the other layer or substrate, or intervening layers may also be present.

In one aspect, the invention provides semiconductor capacitors. The semiconductor capacitors comprise first electrodes, second electrodes, and tantalum oxide layers positioned between the first electrodes and the second electrodes. The tantalum oxide layers are formed from by depositing at least one precursor and ozone gas on the first electrode. The precursor is represented by the formula:

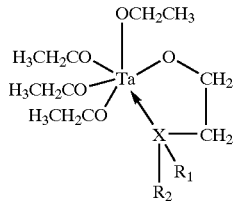

wherein X is selected from the group consisting of nitrogen, sulfur, oxygen, and a carbonyl group; and $R_1$ and $R_2$ are independently alkyl (e.g., $C_1$ to $C_4$ alkyl).

In one preferred embodiment, $R_1$ and $R_2$ are each methyl and X is nitrogen.

The tantalum oxide layer may be formed by various techniques. In one embodiment, for example, the tantalum oxide layer may be formed by depositing the precursor and a source gas on the first substrate. The source gas is preferably present as ozone gas.

Various materials can be employed in the first electrode of the invention. Examples of such materials can include, without limitation, a polysilicon, a noble metal, a conductive metal nitride, and combinations thereof. Exemplary noble metals include, without limitation, Ru, Ir, Pt, and combinations thereof. Exemplary conductive metal nitrides include, without limitation, TiN, TaN, WN, and combinations thereof. These same materials may also be included, without limitation, in the second electrode of the invention.

As described in detail, the tantalum oxide may be deposited using various conditions. In one preferred embodiment, the tantalum oxide layer is deposited at a temperature ranging from about 100° C. to about 600° C.

In another aspect, the invention provides methods of making semiconductor capacitors. The methods comprise forming a first electrodes on semiconductor substrates, forming tantalum oxide layers on the first electrodes by depositing at least one precursor and ozone gas thereon. The precursor is represented by the formula:

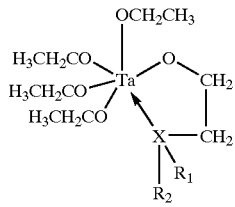

wherein X is selected from the group consisting of nitrogen, sulfur, oxygen, and a carbonyl group; and $R_1$ and $R_2$ are independently alkyl including, for example, $C_1$ to $C_4$ alkyl, and forming a second electrode on the tantalum oxide layer.

The methods of the invention may be carried out according to various preferred embodiments, although it will be appreciated that these embodiments are non-limiting and that the invention may be practiced by employment of other embodiments. In one embodiment, the step of forming tantalum oxide layers on the first electrodes injecting the one or more precursors, ozone gas and a purge gas on the first electrode sequentially. In another embodiment, the methods further comprise the step of forming a tantalum preprocessed layer on the surface of the first electrode by depositing at least one tantalum precursor including an oxygen bond by chemical vapor deposition prior to the step of forming a tantalum oxide layer on the first electrode. Examples of the one or more tantalum precursors include, without limitation, $Ta(OC_2H_5)_5$, $Ta(OCH_3)_5$, and combinations thereof.

Examples of purge gas that may be used in the methods of the invention include, without limitation, argon, nitrogen, or mixtures thereof.

The methods of the invention can be carried out under various processing conditions. In one embodiment, for example, the step of depositing one or more precursors on the first electrode occurs at a temperature ranging from about 100° C. to about 600° C.

The present invention will now be illustrated more fully with reference to the accompanying drawings, in which preferred embodiments of the invention are shown. It should be appreciated that the embodiments presented in the drawings are for illustrative purposes only, and do not limit the scope of the present invention.

FIG. 1 illustrates an example of a structure of a capacitor formed according to the present invention. In this embodiment, the capacitor is cylindrical, although it should be appreciated that the capacitor may be formed as other geometries. Referring to FIG. 1, the capacitor has a structure in which a TEOS layer 100 having a cylindrical opening, a lower electrode 110, a tantalum oxide layer 120 and an upper electrode 130 are sequentially deposited along the TEOS layer 100. The lower electrode can be formed of polysilicon, a noble metal such as Ru, Pt, Ir, or combinations thereof, and a conductive metal nitride layer such as TiN, TaN, WN, or combinations thereof. In addition to employment of a single metal nitride layer, a solid solution nitride layer such as, for example, (Ti, Ta)N can be used as the upper electrode, along with other materials. Also, a composite layer formed by depositing at least two materials described above can be used.

In one embodiment according to the present invention, the tantalum oxide layer may formed by chemical vapor deposition using tantalum precursors of a monomer expressed by Formula A and ozone as a source gas.

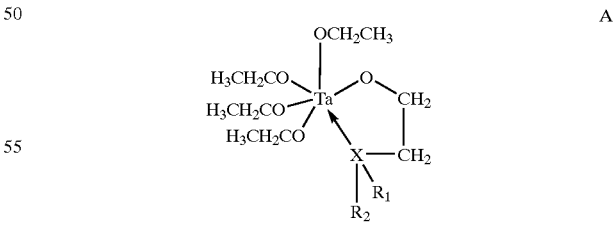

wherein X has a coordination bond with Ta formed through an unshared electron pair. It is preferable that X is N, S, O, or C=O. $R_1$ and $R_2$ are independently selected as an alkyl group such as, for example, preferably a $C_1$ to $C_4$ alkyl group. In a preferred embodiment, $R_1$ and $R_2$ are each methyl groups.

In this embodiment, ozone is used as an oxygen source for depositing the tantalum oxide layer of the present invention.

The ozone gas can be used as an oxidizer for forming a tantalum oxide layer at a temperature below, for example, 400° C., in contrast to the thermal conditions employed using $O_2$, $H_2O$ or $N_2O$ as gases. It should be appreciated that other temperature conditions can be employed.

The chemical vapor deposition method can be performed, for example, by general thermal chemical vapor deposition or atomic layer deposition techniques, as well as other techniques. According to the thermal chemical vapor deposition method, tantalum precursors and ozone gas simultaneously flow into a deposition chamber. Conversely, tantalum precursors and ozone gas sequentially flow into a deposition chamber to deposit a tantalum oxide layer in an atomic layer deposition method.

One example of an atomic layer deposition method of the present invention may be carried out as follows. It should be appreciated that variations from this method can occur with departure from the scope of the invention. First, a semiconductor substrate is introduced into a deposition chamber. A lower electrode 110 is present thereon. Next, tantalum precursors expressed by Formula A are introduced into the deposition chamber, and the tantalum precursors are chemically or physically adsorbed on the surface of an Ru electrode 110 of the semiconductor substrate. The tantalum precursors are typically provided by a bubbling method or a liquid delivery system (LDS) method. After the adsorption is complete and a predetermined time has elapsed, nitrogen, or an inert purge gas such as argon, is introduced into the deposition chamber to preferably remove the remaining tantalum precursors from the deposition chamber, with the exception of the adsorbed tantalum precursors. After a predetermined time has elapsed, the inflow of the purge gas is stopped, and ozone gas is introduced into the deposition chamber. The ozone gas is believed to react with the adsorbed tantalum precursors to form a tantalum oxide layer. After the inside of the deposition chamber is purged with nitrogen or inert gas such as argon, a cycle of: (1) inflow of tantalum precursors, then (2) inflow of purge gas, then (3) inflow of ozone gas, and then (4) inflow of purge gas is carried out repeatedly to form a tantalum oxide layer 120 having a desired thickness.

During the deposition, it is preferable that the flow rate of the tantalum precursors range from about 1 to about 2000 sccm. Nitrogen or argon is preferably employed as the purge gas, and the flow rate preferably ranges from about 1 to about 2000 sccm. The ozone gas flow rate preferably ranges from about 1 to about 2000 sccm. The temperature of the deposition chamber preferably ranges from 100° C. to about 600° C., and the pressure of the deposition chamber preferably ranges from about 0.1 Torr to about 30 Torr.

After formation of the lower electrode 110 and before formation of the tantalum oxide layer 120, a process for forming a tantalum preprocessed layer (not shown) can be additionally performed by repeating the inflow and purging of the tantalum precursors expressed by Formula A. This sequence can result in the simplification of the formation of the tantalum oxide layer. In such an embodiment, a thin tantalum oxide layer is formed on the lower electrode with the tantalum precursors. The tantalum oxide layer is advantageous in that it helps to minimize or prevent oxidation of the lower electrode in an oxygen atmosphere to form a tantalum oxide layer having superior step coverage.

An upper electrode 130 is formed on a dielectric layer 120, the dielectric layer being fabricated as set forth above. The upper electrode can be formed of polysilicon, a noble metal such as Ru, Pt, Ir or combinations thereof, or a nitride layer such as TiN, TaN, WN, or combinations thereof. It should be appreciated that other materials can also be employed as well. Naturally, in addition to a single metal nitride layer being used as the upper electrode, a solid solution nitride layer such as (Ti, Ta)N can be used as the upper electrode. Also, a composite layer may be formed by depositing at least two of the materials described above.

The invention will now be described in greater detail in reference to the examples. It should be understood that the examples merely illustrate the invention and are not intended to limit the scope of the invention as defined by the claims.

EXAMPLE 1

A tantalum dielectric layer was formed on a cylindrical Ru lower electrode having an aspect ratio of about 15 using tetraethoxy tantalum dimethylamino-ethoxide (TAT-DMAE) as tantalum precursors and $O_3$ gas as an oxygen source. The dielectric layer was formed by an atomic layer deposition method having a cycle of inflow of tantalum precursors→ purging→ inflow of $O_3$→ purging. In this example, the temperature of the chamber was maintained at 250° C., 300° C., 350° C. and 400° C. The thickness of the upper portion of a tantalum oxide layer deposited at each temperature ($t_1$ of FIG. 1) and the thickness of the lower portion of the tantalum oxide layer ($t_2$ of FIG. 1) were measured. Results are set forth in Table 1.

TABLE 1

| Classification | 250° C. | 300° C. | 350° C. | 400° C. |
|---|---|---|---|---|
| $t_1$ (Å) | 240 | 103 | 233 | 244 |
| $t_2$ (Å) | 220 | 102 | 207 | 228 |

As shown in Table 1, the thicknesses of the deposited layers vary with temperature. Notwithstanding these differences, it was observed that the tantalum oxide layers were generally are uniform in thickness in their respective upper portions and lower portions.

COMPARATIVE EXAMPLE 1

Figure 2A:
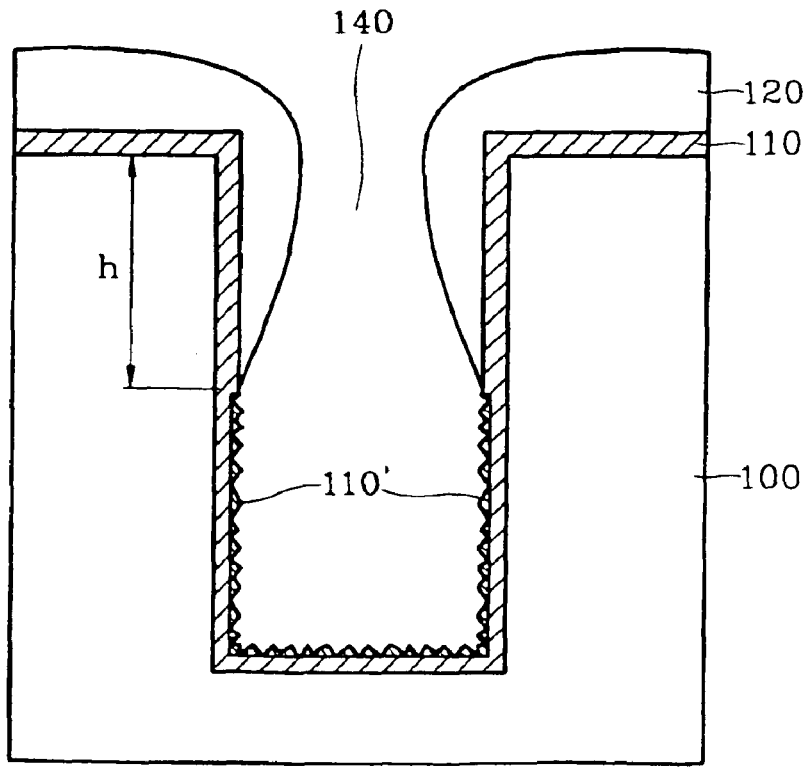
FIGS. 2A and 2B schematically illustrate sections of prior art substrates wherein tantalum oxide layers are formed using $H_2O$ and $O_2$ respectively, as oxygen sources.
Figure 2B:
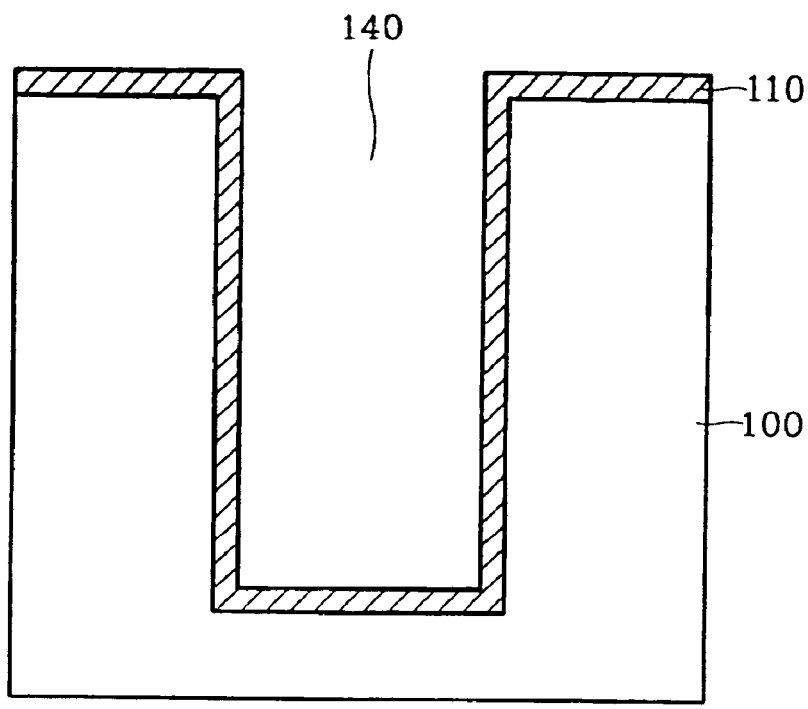

For comparison with the present invention, a tantalum oxide layer was formed by an atomic layer deposition method at a temperature of 350° C. using PET as a tantalum precursor, and $H_2O$ and $O_2$ gases as oxygen sources, respectively. FIGS. 2A and 2B schematically illustrate sections of the substrate when tantalum oxide layers are formed using the above-mentioned source gases. When $H_2O$ was employed as the oxygen source gas, the tantalum oxide layer 120 was formed on the upper portion of an opening 140, but the tantalum oxide layer 120 was not formed on the lower portion of the opening 140 as illustrated in FIG. 2A. It is believed that the formation of the tantalum oxide layer 120 was prevented because of the presence of $RuO_2$, 110', formed by surface oxidation of the Ru layer 110 in the lower portion of the opening. As shown in FIG. 2B, when the $O_2$ is employed as the oxygen source gas, the presence of the tantalum oxide layer was disuniform over opening 140.

COMPARATIVE EXAMPLE 2

Tantalum oxide layers were formed by an atomic layer deposition method at temperatures of 250° C., 300° C., 350° C. and 400° C. using PET as a tantalum precursor and $O_3$ as the oxygen source.

This example illustrates similar behavior to Comparative Example 1 which employed $H_2O$ as the oxygen source gas. Referring to FIG. 2A, the tantalum oxide layer 120 was formed on the upper portion of the cylindrical opening 140 at each temperature. The tantalum oxide layer was not formed on the lower portion. As the deposition temperature was increased, the depth to which the tantalum oxide layer 120 was formed (designated as h in FIG. 2A) tended to increase. Table 2 illustrates the thicknesses (designated as $t_1$ and $t_2$ in FIG. 1) of the upper portion and lower portion of the tantalum oxide layers 120 formed at 300° C. and 350° C., and also the depth to which the tantalum oxide layer 120 was formed (designated as h in FIG. 2A).

TABLE 2

| Classification | 300° C. | 350° C. |
|---|---|---|
| $t_1$ (Å) | 549 | 456 |
| $t_2$ (Å) | ~0 | ~0 |
| h (Å) | 3000 | 6700 |

Although not intending to be bound by theory, one possible reason as to why tantalum precursors of the present invention expressed by Formula A display superior coverage to other tantalum precursors, such as for example PET, will be described with respect to steric hindrance believed to be attributable to equilibrium vapor pressure and sticking probability impacting the tantalum precursor molecular structure.

Figure 3:
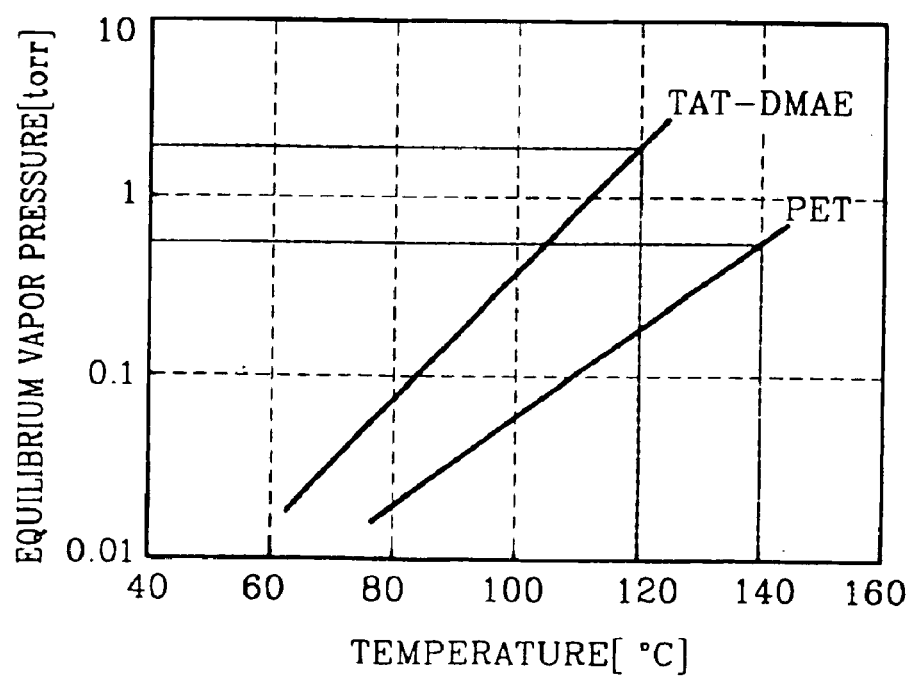
FIG. 3 is a graph illustrating equilibrium vapor pressure with respect to temperature of PET and TAT-DMAE precursors according to the present invention.

FIG. 3 illustrates equilibrium vapor pressure with respect to temperatures of PET and TAT-DMAE. As shown, the equilibrium vapor pressure of TAT-DMAE is higher than that of PET. Therefore, at the same temperature, the equilibrium vapor pressure of TAT-DMAE is generally much higher than that of PET over the temperature range. In accordance with an embodiment of the present invention, since a tantalum precursor source gas is provided at 140° C. with respect to PET and at 120° C. with respect to TAT-DMAE, the equilibrium vapor pressure of TAT-DMAE is observed to be about twice as great as that of PET. A high equilibrium vapor pressure indicates that there are a greater number of gaseous molecules relative to a system having a lower equilibrium vapor pressure. With respect to a TAT-DMAE system, the amount of tantalum source gas provided into the deposition chamber is relatively sizeable. Accordingly, the number of molecules directly provided to the lower portion of the cylindrical opening is believed to be relatively large. Therefore, TAT-DMAE employed as precursors in accordance with the present invention can form a tantalum oxide layer exhibiting superior coverage to conventional PET.

Not intending to be bound by theory, it is believed that the discrepancies in vapor pressures can be attributed to a steric effect. According to Bradley, "Metal Alkoxides as Precursors for Electronic and Ceramic Materials" American Chemical Society, Chem. Rev., (1989), small alkoxides have a greater tendency to form oligomers such as dimers, trimers by bridging alkoxides groups than alkoxides of greater steric bulk. This discrepancy is believed to exert a sizeable influence on alkoxide vapor pressure.

Accordingly, since an oxygen atom present in PET has a tendency to increase its coordination number by forming a covalent bond with a neighboring tantalum atom, the PET is likely to have the following molecular structure in a liquid state (see Formula B).

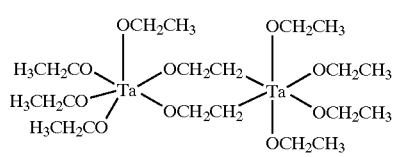

Conversely, with respect to a TAT-DMAE embodiment, because a nitrogen atom, which has a covalent bond with oxygen, has a coordination bond with a Ta atom, the TAT-DMAE exists as a monomer in a liquid state and can be expressed by the following structural formula (Formula C).

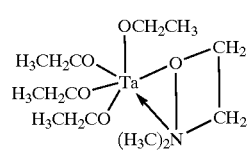

Accordingly, and although not intending to be bound by theory, it is believed that since PET has a higher thermal stability than the TAT-DMAE precursors of the present invention, the PET requires a greater level of much energy to break a bond between molecules to be volatilized and thus has a lower vapor pressure.

Another factor which potentially influences precursor coverage relates to sticking probability. According to Kawahara, "Conformal Step Coverage of (Ba, Sr)TiO$_3$ Films Prepared by Liquid Source CVD Using Ti(t-BuO)$_2$(DPM)$_2$", Japanese Journal of Applied Physics, Vol. 38, pp. 2205–2209, when Ti(t-BuO)$_2$(DPM)$_2$ precursors are used, (Ba, Sr)TiO$_3$ thin film has superior step coverage relative to embodiments which employ Ti(DPM)$_2$ precursors. Because the sticking probability of the Ti(t-BuO)$_2$(DPM)$_2$ referenced by Kawahara is estimated to be about 0.02, and the sticking probability of the Ti(DPM)$_2$ is estimated to be about 0.1, a thin film having superior coverage can be obtained when the sticking probability is low.

According to Si-woo Lee et al., "Chemical Vapor Deposition Precursors for (Ba, Sr)TiO$_3$ Films", 6$^{th}$ Korean Semiconductor Seminar, the deposition of Ti may be carried out using the surface reaction as a rate determining step, and high coverage may be achieved by virtue of the surface movement of Ti.

In view of all potential factors, and although not intending to be bound by theory, it is believed that Ti precursors possessing low sticking probability are particularly desirable suitable for making a thin film having high coverage, presumably due to relative ease of surface movement. With respect to precursor steric hindrance, since generally small precursors have a higher sticking probability than bulky precursors, the TAT-DMAE precursors may have a lower sticking probability than PET. Although not intending to be bound by theory, this may explain the superior coverage of TAT-DMAE.

Figure 4:
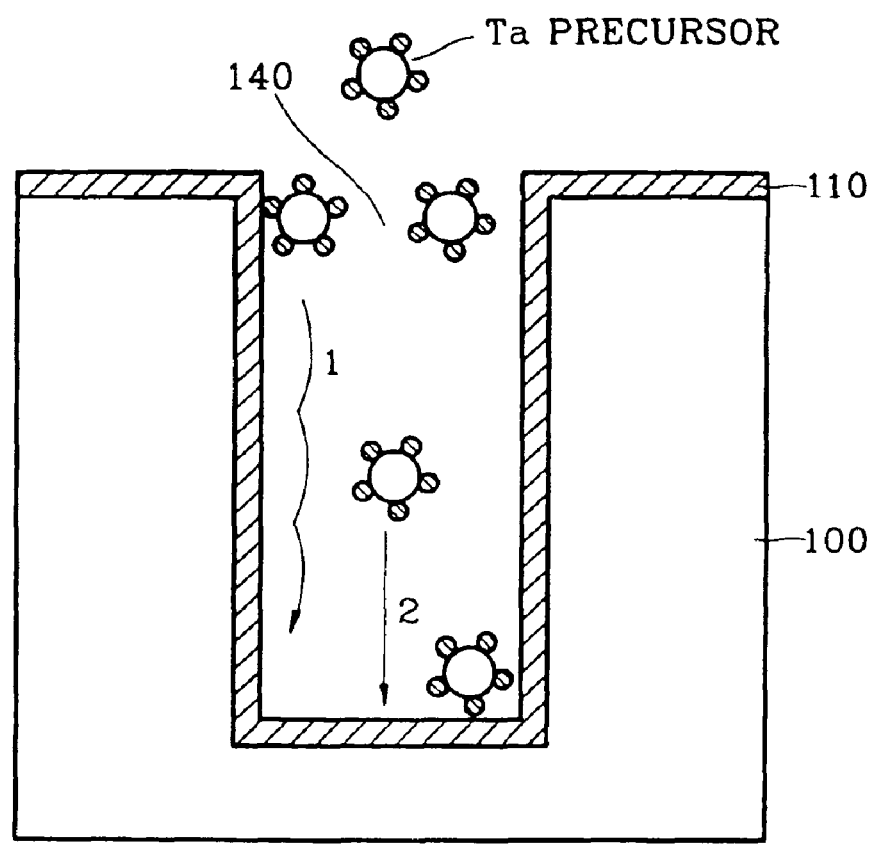
FIG. 4 typically illustrates an adsorption mechanism of gaseous tantalum precursors on an Ru lower electrode according to the present invention.

FIG. 4 depicts an embodiment illustrating an adsorption mechanism of gaseous tantalum precursors on an Ru lower electrode 110 according to the present invention. Not intending to be bound by theory, the mechanism in which the tantalum precursors reach the lower portion of the opening formed by the Ru lower electrode 110 is believed to be attributable to: (a) surface movement (1) from the upper portion of the opening 140 or (b) direct transmission (2) to the lower portion of the opening 140. Accordingly, as illustrated in FIGS. 2A or 3, to minimize or prevent oxidation of Ru in the lower portion of the Ru lower electrode 110, the provided tantalum precursors should preferably be uniformly adsorbed, and preferably cover the entire lower electrode 110 by surface diffusion or direct transmission. In order to carry out this procedure in optimal fashion, surface movement of the precursors adsorbed on the substrate should preferably be unencumbered, and the vapor pressure should be sufficiently high to accommodate a plurality of precursors. In particular, precursors such as TAT-DMAE of the present invention typically possess a higher vapor pressure relative to conventional precursors such as PET.

According to the present invention, it is possible to form a semiconductor capacitor having a tantalum oxide layer which exhibits superior coverage to a conventional layer by using tantalum precursors having an atom or an atomic group which has a coordination bond with a tantalum atom.

The present invention has been described in detail with respect to the preferred embodiments in the specification set forth hereinabove. It should be understood that these embodiments are intended to illustrate the invention and are not meant to limit the scope of the invention as defined by the claims.

What is claimed:

1. A method of making a semiconductor capacitor comprising:

forming a first electrode on a semiconductor substrate; and forming a tantalum oxide layer on the first electrode by depositing at least one precursor and ozone gas, the at least one precursor represented by the formula:

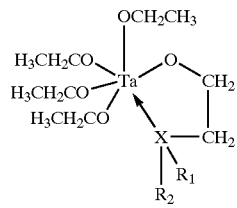

wherein X is selected from the group consisting of nitrogen, sulfur, oxygen, and a carbonyl group; and $R_1$ and $R_2$ are independently alkyl; and forming a second electrode on the tantalum oxide layer.

2. The method according to claim 1, wherein said step of forming a tantalum oxide layer on the first electrode comprises injecting the at least one precursor, the ozone gas and a purge gas on the first electrode sequentially.

3. The method according to claim 1, further comprising the step of forming a tantalum preprocessed layer on the surface of the first electrode by depositing at least one tantalum precursor including oxygen bond by chemical vapor deposition prior to said step of forming a tantalum oxide layer on the first electrode.

4. The method according to claim 3, wherein the at least one tantalum precursor is selected from the group consisting of $Ta(OC_2H_5)_5$ and $Ta(OCH_3)_5$.

5. The method according to claim 1, wherein the first electrode comprises polysilicon, a noble metal, a metal nitride, and combinations thereof.

6. The method according to claim 5, wherein the noble metal is selected from the group consisting of Ru, Ir, Pt, and combinations thereof.

7. The method according to claim 5, wherein the metal nitride is selected from the group consisting of TiN, TaN, WN, and combinations thereof.

8. The method according to claim 1, wherein the purge gas is argon, nitrogen, or mixtures thereof.

9. The method according to claim 1, wherein $R_1$ and $R_2$ are each methyl and X is nitrogen.

10. The method according to claim 1, wherein $R_1$ and $R_2$ are independently $C_1$ to $C_4$ alkyl.

11. The method according to claim 1, wherein said step of depositing the at least one precursor on the first electrode occurs at a temperature ranging from about 100° C. to about 600° C.

12. The method according to claim 1, further comprising uniformly depositing the tatalum oxide layer.

13. A method of making a semiconductor capacitor comprising:

forming a first electrode on a semiconductor substrate;

uniformly forming a tantalum oxide layer on the first electrode by depositing at least one precursor and ozone gas, the at least one precursor represented by the formula:

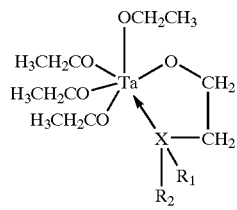

wherein X is selected from the group consisting of nitrogen, sulfur, oxygen, and a carbonyl group; and $R_1$ and $R_2$ are independently alkyl; and forming a second electrode on the uniform tantalum oxide layer.

14. The method according to claim 13, wherein said step of forming a tantalum oxide layer on the first electrode comprises injecting the at least one precursor, the ozone gas and a purge gas on the first electrode sequentially.

15. The method according to claim 13, further comprising the step of forming a tantalum preprocessed layer on the surface of the first electrode by depositing at least one tantalum precursor including oxygen bond by chemical vapor deposition prior to said step of forming a tantalum oxide layer on the first electrode.

16. The method according to claim 15, wherein the at least one tantalum precursor is selected from the group consisting of $Ta(OC_2H_5)_5$ and $Ta(OCH_3)_5$.

17. The method according to claim 13, wherein the first electrode comprises polysilicon, a noble metal, a metal nitride, and combinations thereof.

18. The method according to claim 17, wherein the noble metal is selected from the group consisting of Ru, Ir, Pt, and combinations thereof.

19. The method according to claim 17, wherein the metal nitride is selected from the group consisting of TiN, TaN, WN, and combinations thereof.

20. The method according to claim 13, wherein the purge gas is argon, nitrogen, or mixtures thereof.

21. The method according to claim 13, wherein $R_1$ and $R_2$ are each methyl and X is nitrogen.

22. The method according to claim 13, wherein $R_1$ and $R_2$ are independently $C_1$ to $C_4$ alkyl.

23. The method according to claim 13, wherein said step of depositing the at least one precursor on the first electrode occurs at a temperature ranging from about 100° C. to about 600° C.

* * * * *